US010948549B2

(12) United States Patent
Höfig et al.

(10) Patent No.: US 10,948,549 B2
(45) Date of Patent: Mar. 16, 2021

(54) APPARATUS AND METHOD FOR A REUSABLE FUNCTIONAL FAILURE TEST FOR A SPECIFIC TECHNICAL SYSTEM

(71) Applicant: Siemens Aktiengesellschaft, Munich (DE)

(72) Inventors: Kai Höfig, Munich (DE); Luke Wildman, Brisbane (AU)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 413 days.

(21) Appl. No.: 15/918,389

(22) Filed: Mar. 12, 2018

(65) Prior Publication Data
US 2018/0267090 A1    Sep. 20, 2018

(30) Foreign Application Priority Data

Mar. 16, 2017  (EP) ..................... 17161320

(51) Int. Cl.
*G01R 31/50*   (2020.01)
*G06F 16/23*   (2019.01)
*G06Q 10/00*   (2012.01)
*G06Q 10/06*   (2012.01)
*G01R 31/28*   (2006.01)

(52) U.S. Cl.
CPC ......... *G01R 31/50* (2020.01); *G01R 31/2829* (2013.01); *G06F 16/2379* (2019.01); *G06Q 10/00* (2013.01); *G06Q 10/0637* (2013.01)

(58) Field of Classification Search
CPC .. G01R 31/2829; G01R 31/025; G01R 31/50; G06F 16/2379; G06F 17/30377
See application file for complete search history.

(56) References Cited

U.S. PATENT DOCUMENTS

| | | | |
|---|---|---|---|
| 7,716,543 B2 * | 5/2010 | Grimes | G06F 11/26 702/118 |
| 9,595,824 B2 * | 3/2017 | Batko | H02H 3/044 |
| 10,489,287 B2 * | 11/2019 | Friedenberg | G06F 11/3692 |
| 10,514,954 B2 * | 12/2019 | Crabtree | G06N 20/00 |
| 2013/0205398 A1 | 8/2013 | Kalman et al. | |
| 2013/0254747 A1 | 9/2013 | Citron | |
| 2015/0378802 A1 | 12/2015 | Hofig | |

OTHER PUBLICATIONS

Extended European Search Report dated Aug. 28, 2017 for Application No. 17161320.1; 9 pages.

* cited by examiner

*Primary Examiner* — Elias Desta
(74) *Attorney, Agent, or Firm* — Schmeiser, Olsen & Watts LLP (57) ABSTRACT

A computer based method for a reusable functional failure test for a specific technical system, e.g., a traffic light system is provided. The method avoids inconsistencies in the functional failure test and reuses items of the respective data structures. Furthermore, the embodiment can identify components or electronic devices that do exceed assumed failure rates and that might be repaired or replaced to keep implementations of the specific technical in the desired failure rate limitations of the analysis, which can be done during the operation of the specific technical system.

15 Claims, 6 Drawing Sheets

FIG 1

| | FIG 1A | FIG 1B |
|---|---|---|

FIG 1A

| C1 | C2 | C3 | C4 | C5 | C6 | C7 | C8 | C9 |
|---|---|---|---|---|---|---|---|---|
| Nr. | Type | Part | Circuit ID | Function | λ | Failure Mode | Effect | % |
| | | | | | | | | |
| 1 | Capacitor | 10nF/120V | C101 | smooth output | 10.00 | short circuit | amplification factor execeeds | 50% |
| | | | | | 10.00 | open circuit | limitations | 50% |
| | | | | | 10.00 | Copy this line | no effect | 0% |
| | | | | | 0.00 | Do not copy this line | | 100% |
| 2 | Resistor | 10kOhm | R305 | regulates amplification factor | 20.00 | short circuit | no effect | 50% |
| | | | | | 20.00 | open circuit | amplification factor execeeds | 50% |
| | | | | | 20.00 | Copy this line | limitations | 0% |
| | | | | | 00.00 | Do not copy this line | | 100% |

FIG 1B

| C10 safe | C11 dang | C12 * | C13 $\lambda_s$ | C14 $\lambda_d$ | C15 $\lambda^*$ | C16 Diagnosis | C17 DCcomp | C18 $\lambda_{du}$ | C19 $\lambda_{dd}$ |
|---|---|---|---|---|---|---|---|---|---|
| 0 | 1 | 0 | 0,000 | 5,000 | 0,000 | Pulsed test will detect this failure | 90,0 | 0,50 | 4,50 |
| 0 | 0 | 1 | 0,000 | 0,000 | 5,000 | | 0,0 | 0,00 | 0,00 |
| 0 | 1 | 0 | 0,000 | 0,000 | 0,000 | | 0,0 | 0,00 | 0,00 |
| | | | | | | | | | |
| 0 | 0 | 1 | 0,000 | 0,000 | 10,000 | | 0,0 | 0,00 | 0,00 |
| 0 | 1 | 0 | 0,000 | 10,000 | 0,000 | Pulsed test will detect this failure | 90,0 | 1,00 | 9,00 |
| 0 | 1 | 0 | 0,000 | 0,000 | 0,000 | | 0,0 | 0,00 | 0,00 |

FIG 6

APPARATUS AND METHOD FOR A REUSABLE FUNCTIONAL FAILURE TEST FOR A SPECIFIC TECHNICAL SYSTEM

CROSS-REFERENCE TO RELATED APPLICATION

This application claims priority to European Application No. 17161320.1, having a filing date of Mar. 16, 2017, the entire contents of which are hereby incorporated by reference.

FIELD OF TECHNOLOGY

The Functional Failure Analysis (FFA) examines the consequences of potential failures on the functionality of a system. Different variations of FFAs are currently used in most domains to analyze safety critical systems. Since modern safety critical systems tend to increased complexity, automations and tool support have a long history in research and industry.

BACKGROUND

Whereas compact embedded systems can be analyzed using a Functional Failure Analysis (FFA) in a manually maintained table, more complex systems easily result in an unmanageable long table especially when larger development teams are involved.

SUMMARY

An aspect relates to a more flexible method and a system with reusable items for a consistent functional failure test.

A first aspect of embodiments of the invention provides a computer based method for a reusable functional failure test for a specific technical system with the following steps:
- selecting from items of a first data structure at least one component for each technical element of the specific technical system, wherein
  - each component can comprise at least one function,
  - each function can comprise at least one failure mode,
  - each failure mode can comprise at least one effect,
  - each item comprises a unique identifier,
  - identical items are reused;
- instantiating a second data structure based on the selected items for the specific technical system, wherein a processor instantiates the respective items;
- executing the functional failure test for the specific technical system by calculating the failure rates for each component;
- testing each component whether the respective component exceeds a predefined failure rate.

Unless specifically stated otherwise, as apparent from the following discussions, it is appreciated that throughout the specification discussions utilizing terms such as "processing", "computing", "computer-based", "calculating", "determining", "generating", "configuring" or the like, refer to the action and/or processes of a computer that manipulates and/or transforms data into other data, said data represented as physical, e.g. such as electronic, quantities. The term "computer" should be expansively construed to cover any kind of electronic device with data processing capabilities, including, by way of non-limiting example, personal computers, servers, handheld computer systems, Pocket PC devices, Cellular communication device and other communication devices with computing capabilities, processors and other electronic computing devices.

As used herein, the term "processor" refers, for example, to controllers, microcontrollers (e.g. digital signal processor (DSP) possibly in combination with memory and storage units memory unit storing computer-readable instructions, application specific integrated circuit "ASIC", etc.), processor cores, central processing units, integrated circuits/processing circuitry (e.g. application specific integrated circuit "ASIC", field programmable gate arrays "FPGA" etc.) or digital signal processors. Furthermore, the term "processor" can, for example, refer to virtual processors, virtual CPUs, soft processors or soft CPUs. Moreover, said processor can, for example, be configured to execute computer readable instructions such that said processor is preferably configured to perform functions which implement embodiments of the invention.

As used herein, the term "module" refers, for example, to a processor and/or a memory unit, storing computer-readable instructions. For example, the processor is specifically configured to execute the computer readable instructions such that said processor is preferably configured to perform functions which implement embodiments of the invention, such as a step of the inventive method.

As used herein, the term "items" or "item" of a first data structure refer, for example, to the data elements of a functional failure test or functional failure analysis, e.g. a system (dataset) and/or a component (dataset) and/or a function (dataset) and/or a failure mode (dataset) and/or an effect (dataset) and/or a specific mitigation (dataset) and/or an additional specific mitigation (dataset) and/or a potential accident (dataset). For example, the system (dataset) can describe the specific technical system in a general manner. Furthermore, the failure mode can, for example, have predefined states, e.g., loss, timeliness, incorrect and spurious.

As used herein, the term "items" or "item" of a second data structure refer, for example, to the selected and instantiated items of the first data structure.

As used herein, the term "reusing an item" or the like refers, for example, to instantiate an identical item multiple times. Preferably, during the selection of the items of the first data structure references to the items or their unique identifiers are kept. For example, if an item is reused/or used multiple times the corresponding unique identifier is referenced multiple times.

As used herein, the term "second data structure" refers, for example, to a data model containing the selected and instantiated items of the first data structure to conduct the functional failure test for the specific technical system.

As used herein, the term "identical item" or the like refers, for example, an item which is selected multiple times. Preferably, this is done, if the specific technical system comprises a technical element several times (e.g., capacitor type 13 is installed fifty times in the specific technical system). Preferably, during the instantiation said item is instantiated several times or only once and the instance is referenced for each of the technical elements. In other words, an identical item refers, for example, items which are associated, for example, to a specific effect or component. If the same technical element, for example, a capacitor, is used multiple times in the specific technical system, the respective component of the technical element is instantiated multiple times. Preferably, the items which are comprised (e.g. failure mode or failure effect) by the component are as well instantiated several times (or reused). Preferably, if another functional failure test is conducted for another specific technical system comprising the same technical elements the respective items (e.g. components) can be reused as well. Preferably, identical items can be identical effects which are reused for identical technical elements of a specific technical system or their representation as a component with its functions, failure modes and effects etc.

As used herein, the term "other instances of the reused item" refers, for example, to other second data structure instantiated for other specific technical systems comprising at least one common technical element.

As used herein, the term "first data structure" refers, for example, to a data model (e.g., a meta data model) or data base providing a plurality of items to conduct a functional failure analysis for one or more specific technical systems.

As used herein, the term "functional failure test" refers, for example, to a functional failure analysis for a (specific) technical system.

As used herein, the term "technical element" refers, for example, to mechanical components and/or to electrical components and/or electro-mechanical components and/or chemical components and/or software components and/or biological components and/or bio-chemical components and/or a combination of these components.

As used herein, the term "system", "a technical system" or "a specific technical system" refers, for example, to a device, apparatus or a plant. A (specific) technical system can, for example, be a field device, a generator or a power plant (e.g., a wind turbine, a nuclear power plant or a water power plant). Preferably, the technical system comprises a plurality of hardware components and/or software components. Furthermore, these systems can, for example, comprise at least one component having a communication interface configured to connect the inventive apparatus and/or a test environment. Furthermore these systems comprise, for example, a plurality of technical elements, preferably hundreds or thousands of technical elements. More particularly, these systems are unmanageable by conventional manual FFA approaches.

Preferably, the inventive method avoids inconsistency of failure effects in the functional failure test. For example, it can be avoided that textually described effects are interpreted differently, which could lead to inconsistencies. Preferably, the functional failure test can be faster executed, because the failure modes of the functional failure test that result in the same effect, e.g. for diagnostic reasons, can be, for example, evaluated at once.

Furthermore, for example, inconsistencies of failure modes are avoided. For example, if one component often is used multiple times in a system, e.g. in electronic circuits where huge circuits are build using a small number of electronic devices. Each implementation of a component results in the same failure modes in the functional failure test. For example, manually inserting them is error prone and adding a new failure mode to an existing component can be very time consuming. Preferably the inventive method avoids these inconsistencies and allows a faster methodology to introduce a new failure mode to an existing component.

In an embodiment of the method each effect can comprise at least one specific mitigation and/or at least one additional specific mitigation and the processor, preferably, instantiates each of the specific mitigation and/or additional specific mitigation for the second data structure.

Preferably, by the inventive method, specific mitigations, such as preventive functions, human interaction or maintenance, can be, for example, assigned to an effect that mitigates the respective effect. Preferably, specific mitigations can be combined with specific additional mitigations to decrease the overall risk to an acceptable level.

In another embodiment of the method each effect can comprise a potential accident and the processor, preferably, instantiates each of the potential accident for the second data structure.

For example, each failure mode of a function results in a certain effect in the specific technical system or its technical elements. For example, the delayed operation of a single function can lead to a delayed operation of the specific technical system or its technical elements. This can, for example, lead to a certain accident. This is modelled, for example, with the potential accident.

In another embodiment of the method the failure modes are loss and/or timeliness and/or incorrect and/or spurious.

For example, each function can fail in different ways which is modelled by the failure modes. For example, a function can be inaccessible which can, for example, be classified as loss, it can be delayed which can, for example, be classified as timeliness, it can be erroneous which can, for example, be classified as incorrect or it can be activated without being intended to which can, for example, be classified as spurious. The first data structure, for example, implies a set of failure modes for each function. For example, by instantiating the second data structure based on the selected items of the first data structure makes the set of failure modes to be analyzed consistent for every function.

In another embodiment of the method each instantiated item comprises a unique instance identifier.

Preferably, the unique instance identifier allows an identification of each instance of an identical item (e.g. identical effect). For example, this can be used to trigger an update for a specific instance or to document or log which instance triggered an update of an item (e.g. an effect) of the first data structure.

In another embodiment of the method an update of one of the reused items and/or item instances of the second data structure and/or the item of the first data structure automatically triggers an update of other instances of the corresponding reused item.

Preferably, this update mechanism ensures that the item instances (e.g., effect instances) are kept consistent.

In another embodiment of the method an update of one of the item instances in the second data structure automatically triggers an update of the corresponding item in the first data structure.

Preferably, this update mechanism ensures that the first data structure and/or the second data structure are kept consistent, if, for example, an effect instance is updated due to a more precise effect description.

In another embodiment of the method one of the item instances of the second data structure is updated by sensor data of the specific technical system.

Preferably, by using a sensor an actual behaviour of a technical element can be observed. For example, by means of the observed behaviour the respective effect (instance) or item (instance) of the second data structure and/or first data structure is updated.

In another embodiment of the method a predefined stimulus signal is transmitted to at least one of the technical elements of the specific technical system. The stimulus signal induces an expected failure mode and/or expected effect, wherein a response of the stimulus signal of the respective technical element is acquired and the response is compared with the expected failure mode and/or expected effect.

Preferably, with these features an analysis of the specific technical system can be conducted by triggering an expected behaviour (e.g., by means of the stimulus signal) of the technical elements of the specific technical system. For example, the responses of the technical elements and/or the specific technical system to the respective stimulus signal are recorded. Preferably, the recorded responses are evaluated and depending on the result the first/second data structures are updated and/or the technical elements and/or the technical systems are checked.

In another embodiment of the method, if the response and the expected failure mode and/or effect diverge from each other, the respective effect instance and/or failure mode instance is updated according to the response.

Preferably, by means of the features of this embodiment the first data structure and/or second data structure can be verified. For example, this can be achieved, where the specific technical system is a reference system with predefined responses. Preferably, by means of this reference system the items of the first data structure and/or second data structure can be calibrated. For example, the calibrated items of the first data structure and/or second data structure can then be used to conduct a functional failure test for another specific technical system with unknown responses to the stimulus signals.

In another embodiment of the method if the response and the expected failure mode and/or effect match, the respective the respective technical element is identified as functional.

Preferably, by means of the features of this embodiment the expected functionality of the technical elements of the specific technical system can be verified.

In another embodiment of the method if the response and the expected failure mode and/or effect diverge from each other, the respective the respective technical element is identified as faulty.

Preferably, by means of the features of this embodiment the quality of the technical elements of the specific technical system can be evaluated.

A further aspect of embodiments of the present invention provides an apparatus for a reusable functional failure test for a specific technical comprising:
a selection module, wherein
the selection module selects from items of a first data structure at least one component for each technical element of the specific technical system,
each component can comprise at least one function,
each function can comprise at least one failure mode,
each failure mode can comprise at least one effect,
each item comprises a unique identifier,
identical items are reused;
an instantiation module for instantiating a second data structure based on the selected items for the specific technical system, wherein a processor instantiates the respective items;
an execution module executing the functional failure test for the specific technical system by calculating the failure rates for each component;
a test module for testing each component whether it exceeds a predefined failure rate of the respective component.

In another embodiment of the apparatus the apparatus comprises one or more further modules to implement other embodiments of the invention.

According to a preferred variant of the computer program product, the program product stores executable instructions adapted to configure a manufacturing device, for example, a 3D-printer or another device to create the inventive device/apparatus or system.

Furthermore, a providing apparatus is claimed for saving and/or providing a program data and/or instruction block of said executable instructions (method and/or device). The providing apparatus can be a data storage saving and/or providing the computer program product. Alternatively, the providing apparatus can be a computer system and/or a server system and/or a network and/or a cloudbased computer system and/or virtual computer system. The providing apparatus saves and/or provides the computer program product. Preferably, the complete computer program product is provided by said providing apparatus in the form of a download, for example, as a file or a data stream. Alternatively, the computer program product is provided by at least two partial downloads, for example, provided by a peer to peer network, each containing a piece of said computer program product. For example such a computer program product can be provided by a data storage, which is read and executed by a computer system. As a consequence the computer system is able to execute the disclosed method. Alternatively and/or additionally, the computer program configures a manufacturing device as above mentioned.

A data storage or computer-readable medium can be electronic, magnetic, optical, or a semiconductor system (or apparatus or device). Examples of a computer-readable medium include, but are not limited to, a semiconductor or solid state memory, magnetic tape, a removable computer diskette, a random access memory (RAM), a read-only memory (ROM), a rigid magnetic disk, an optical disk, etc. Current examples of optical disks include compact disk-read only memory (CD-ROM), compact disk-read/write (CD-R/W) and digital versatile disk (DVD).

Further modifications and variations will emerge from the features of the dependent claims.

BRIEF DESCRIPTION

Some of the embodiments will be described in detail, with reference to the following figures, wherein like designations denote like members, wherein.

DETAILED DESCRIPTION

The accompanying drawings are intended to provide a better understanding of the embodiments. They show embodiments and serve in conjunction with the description to explain principles and concepts of the disclosed subject matter. Other embodiments and many of the cited advantages will emerge in respect of the drawings. The elements of the drawings are not necessarily shown in scale with one another. Identical reference characters here designate identical components or components of comparable effect.

Preferably, a skilled person knowing embodiments of the invention and its embodiments is well aware of the generally known implementation variants (e.g., products) in light of the commonly available state of the art. Consequently, providing a disclosure for each of these possible implementation variants is not necessary. These implementation variants can, for example, be implemented solely as hardware (components), solely as software (components) or as combination of hardware (components) and software (components). Alternatively and/or additionally, choosing any combination of hardware (components) and software (components) to implement embodiments of the invention is very well in scope of the abilities of a skilled person.

Preferably, such an inventive combination of hardware (components) and software (components) achieves the inventive/technical effect by means of a special hardware (e.g., a processor like an ASCI or FPGA specifically configured for this purpose) and/or a (processor based and/or memory based) specific software. Preferably, the interaction between the special hardware and the specific software creates the inventive effect or technical effect.

In light of the uncountable number of implementation variants of embodiments of the invention it is impossible, not necessary and especially not conducive for the understanding of embodiments of the invention to describe all these implementation variants. Consequently, the subsequently following embodiments depict only some possible exemplary implantation variants besides many other possibilities.

Moreover, the features of each embodiment are not limited to the respective embodiment, but preferably refer to embodiments of the invention in general. Consequently, the features of one embodiment can, for example, be used as a feature for another embodiment. Accordingly, it is not necessary to mention this for each embodiment.

Figures 1, 1A:
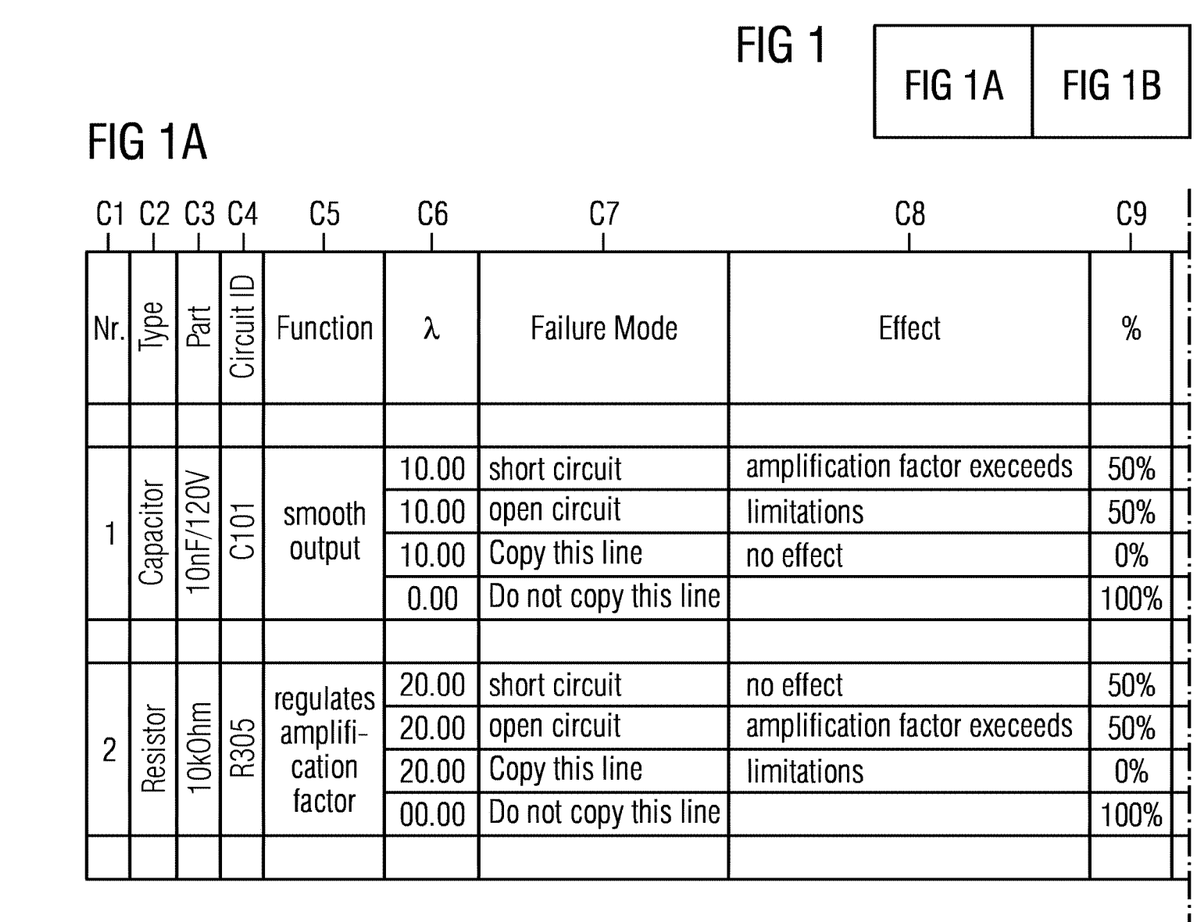
FIG. 1A illustrates a first manually maintained FMEA (or FMEDA) table for conducting a manual functional failure analysis.

FIG. 1 shows a simple manually maintained FMEA table 100 for a compact embedded system.

Failure mode and effects analysis (FMEA) is an inductive reasoning (e.g., forward logic) single point of failure analysis for safety critical systems. Failure mode and effects analysis are available in different variations for different applications, such as software or processes. Failure mode and effects analysis may be either qualitative or quantitative. The variations analyze failure modes of elements and the effects of the failure modes on the analyzed system. A generic quantified FMEA is described for a domain independent application of electrical/electronic/programmable electronic systems in the International Standard IEC 61508. Without the quantifications, the FMEA described therein is also generic for the qualitative variation of the analysis. The variation of FMEA described therein is referred to as a Failure Mode Effects and Diagnostic Analysis, or Failure Mode Effects and Diagnostic Coverage Analysis (FMEDA).

Figure 1B:
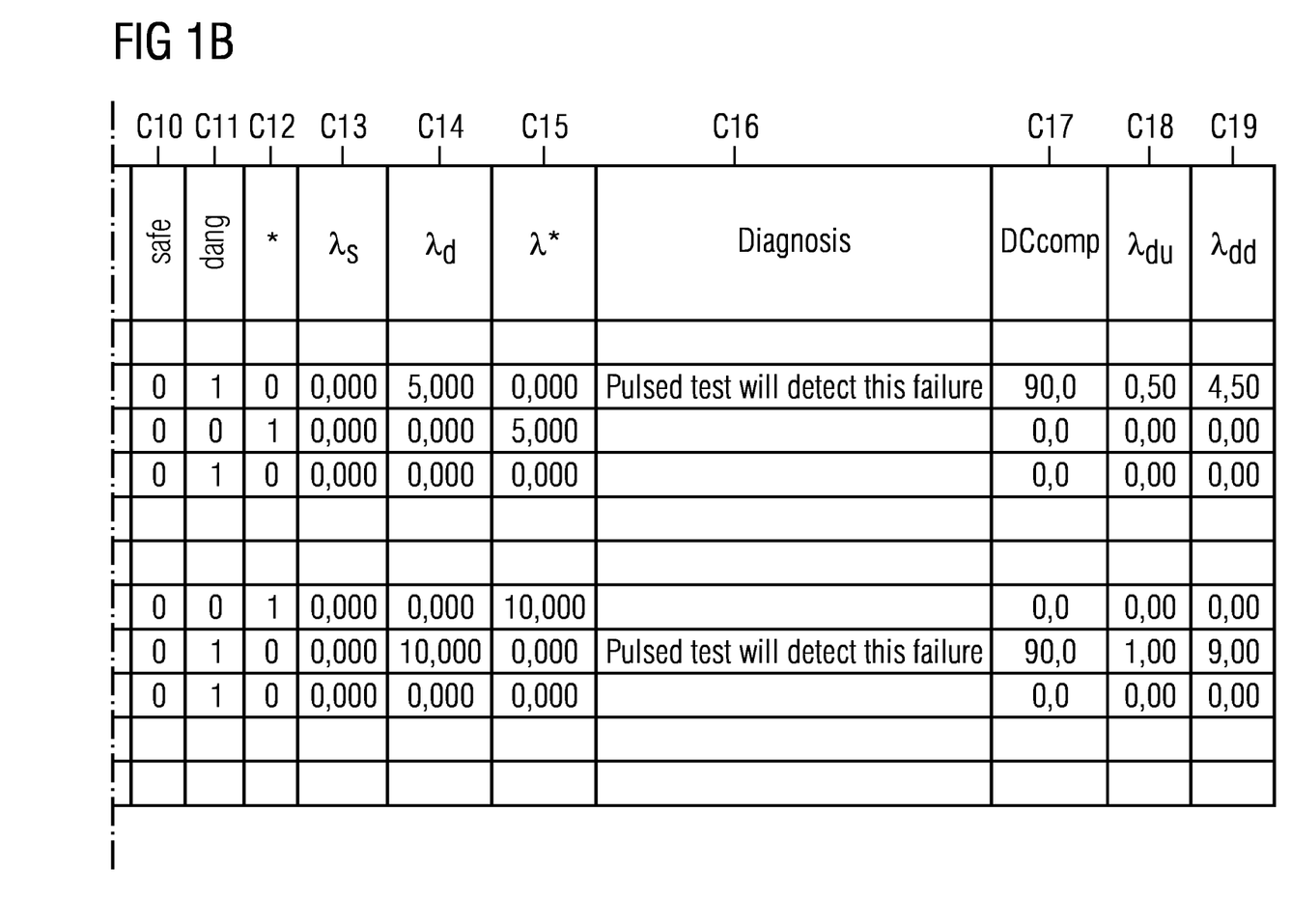
FIG. 1B illustrates a second manually maintained FMEA (or FMEDA) table for conducting a manual functional failure analysis.

A FMEA (or FMEDA) as described in the above-referenced publication is typically developed using a manually maintained table with the support of a spreadsheet processing computer system. FIGS. 1A and 1B collectively show an example of a table from such a system. In column C1 of the table, the analyzed parts are numerated. Parts may be components or electronic devices. In column C2, the type of the analyzed part is indicated, e.g., a capacitor or resistor. In column C3, the electronic type of the part is indicated, e.g., the capacitor is a 10 nF/120V capacitor. In column C4, the identifier is used to identify the part in the specific system is indicated, such as an identification number of the electric circuit plan, e.g., CI0I for the capacitor.

In column C5, the function of the part is textually described. In column C6, the failure rate lambda is indicated, e.g., 10FIT (failure in time, $1*10^{-9}$ per hour) for the capacitor. Column C7 presents the failure modes of the part, such as two metal connectors of the capacitor may either short circuit or be damaged and in an open circuit state. Column C8 is used to describe a failure effect that corresponds with a failure mode. For example, if the capacitor is in an open circuit state, the failure has no consequences. Column C9 is used to allocate (e.g., split) the failure rate lambda (as indicated in column C6) to the individual failure modes. For example, the failure rate of 10FIT of the capacitor is equally split for the two failure modes of the capacitor. Columns C10 to C12 are used to categorize the failure effect into the categories "safe", "dangerous", and "disregard" (or "don't care"). Columns C13 to C15 calculate the residual failure rate for the specific failure effect and category (safe $\lambda_s$, dangerous $\lambda_d$, and disregard $\lambda^*$). For example, the failure rate $\square_d$ for the failure mode "short circuit" is 5FIT since 10FIT (column C6)*50% (column C9)*1(column C11)=5FIT The other columns are calculated accordingly. Column C16 is used to describe a possible diagnostic measure capable of detecting or mitigating a dangerous failure effect. For example, the failure effect corresponding to the failure mode "short circuit" of the capacitor is detected by a pulsed test signal. Column C17 indicates the effectiveness of that measure. For example, the pulsed signals that detect the dangerous failure effect of the open circuit failure mode of the capacitor may only detect or mitigate a fraction of 90% of the occurrences of that failure effect. Column C18 is used to calculate the residual failure rate that a dangerous failure effect goes undetected ($\lambda_d$ undetected, or $\lambda_{du}$). Column C19 is used to calculate the failure rate for the case that the dangerous failure effect is detected by the diagnostic measure ($\lambda_d$ detected, or $\lambda_{dd}$).

The manually maintained table of FIG. 1 may contain automation, such as when implemented in a spreadsheet application. The automation may calculate the values for the different failure rates or completeness of the percentages.

The conventional manual FMEA has following disadvantages:

Inconsistency of Failure Effects:

Typically FMEA tables are long and can contain thousands of lines for complex systems. Also the tables are not filled by a single person but by a team of engineers and designers. That one and the same failure effect is described in multiple ways is highly probable. To analyze the table for a specific failure mode, e.g. how often the failure effect "no output" is contained within the table cannot be analyzed since it might be described textually different for every occurrence of that effect. Without that, also no quantification for this effect is possible since it would require clustering all different descriptions of that effect within one class. The effort can be huge for long manual FMEA tables. Furthermore, since the information about which different effect descriptions actually describe the same effect is not contained in the table, field data from running systems cannot be linked to effects in the FMEA table for diagnostic reasons or to verify the failure rates. E.g., if for one implementation of the system, the effect "amplification exceeds limitations" is observed over and over again, the FMEA table cannot solve the problem of identifying all possible electronic devices that can cause this effect since the effect itself might me described differently within the manual table.

Inconsistency of Failure Modes:

In large systems, especially in electronic circuits, components or devices are used over and over again. E.g. in the example FME(D)A as depicted in FIG. 1, the capacitor can be reused. For every implementation of this device (the capacitor) within the specific technical system, the same failure modes have to be implemented as a row in the FMEA table and to be analyzed for their effect. For large tables, the consistency cannot be guaranteed. Furthermore, if during the design of the system a new failure mode is discovered that was not analyzed before, this new failure mode has to be added to every occurrence of the corresponding component. For a large list or for an already large amount of existing failure modes for a component it can be very time consuming and error prone to manually add the new failure mode to every occurrence of the component. Furthermore, to check whether the failure mode is among the already analyzed failure modes for every occurrence of the component is as well error prone and time consuming. This inconsistency in the set of failure modes of a component also interferes with the ability to measure the effects against field data (e.g., data measured by a sensor during an operation of the (specific technical) system). If field data is used to identify components that possibly cause an effect and the set of failure modes belonging to this component is incomplete due to inconsistencies, field data cannot be used to identify all components that possibly cause this effect.

Figure 2:
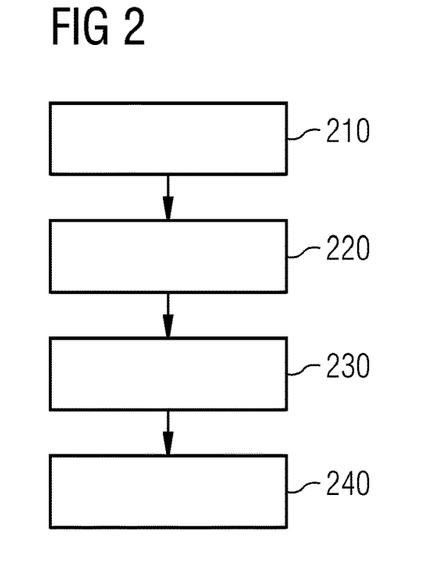
FIG. 2 shows an exemplary embodiment of the method as a chart.

FIG. 2 shows a chart for illustrating a possible exemplary embodiment of a method for conducting a functional failure test for a specific technical system. Preferably, one or more features of this embodiment can be combined with the other embodiments of the invention.

In detail, a computer based method to conduct a reusable functional failure test for a specific technical system is presented.

In a first step 210 at least one component for each technical element of the specific technical system is selected from items of a first data structure, wherein each component can comprise at least one function,
   each function can comprise at least one failure mode,
   each failure mode can comprise at least one effect,
   each item comprises a unique identifier,
   identical items (e.g., identical effects for a specific function and/or its respective component) are reused The first data structure can be, for example, a first data model or a meta data model which is implemented by a first database (e.g. a component database).

The items can, for example, be selected automatically by means of a configuration file or document. Preferably, such a configuration document is implemented as a xml configuration file.

Alternatively, the selection can be implemented on a semi-automatical base, e.g., via a GUI, where an operator can select the respective items for the specific technical system.

In a second step 220, a second data structure based on the selected items for the specific technical system is instantiated, wherein a processor instantiates the respective items (based on the selection of the items of the first data structure), for example, each component with their functions, failure modes and effects.

The second data structure can be, for example, a second data model or an instance data model which is implemented by a second data base (e.g. a product data base). Preferably, the second data structure is specifically configured for the specific technical system.

In a third step 230, the functional failure test for the specific technical system is executed by calculating the failure rates for each component.

The resulting failure rates can, for example, be displayed on a screen together with schematics of the specific technical system and its technical elements. Preferably, the failure rates are directly displayed on their respective technical element on the displayed schematics.

In a fourth step 240, each component is tested, whether the respective component(s) exceed a predefined failure rate of. Preferably, the result is provided by a control signal.

For example, the displayed technical elements can be marked with different colors (e.g., red and green) depending whether the predefined failure rate is exceeded (e.g., red) or the predefined failure rate is met (e.g., green).

Figure 3:
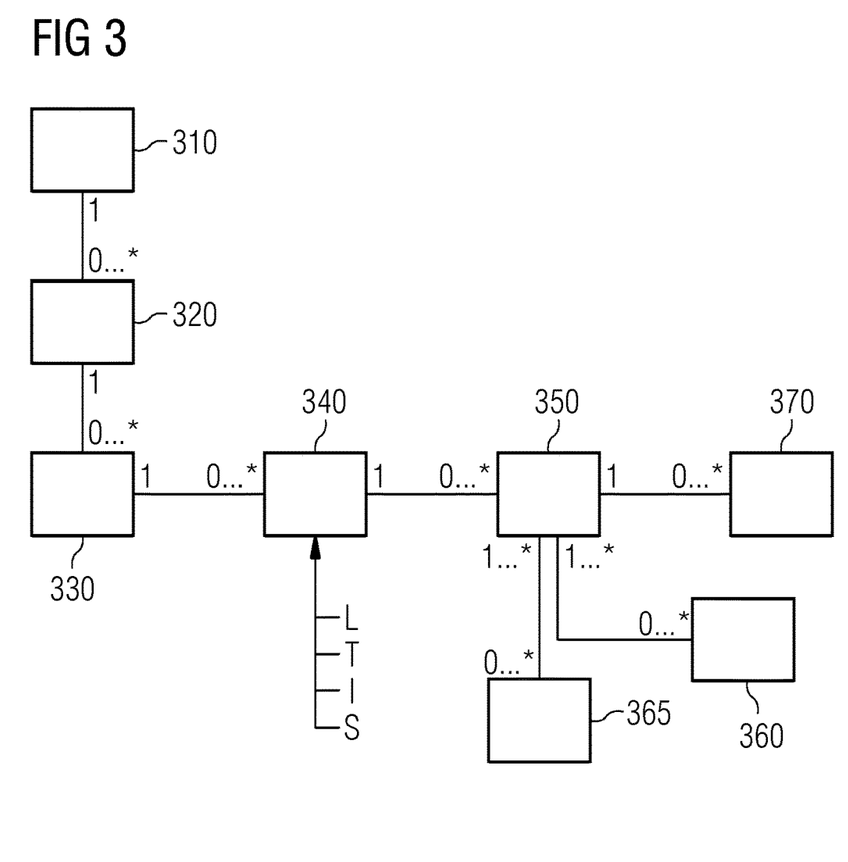
FIG. 3 shows an exemplary embodiment of a first data structure.

FIG. 3 shows a possible exemplary embodiment of a first data structure. Preferably, one or more features of this embodiment can be combined with the other embodiments of the invention.

The first data structure (e.g., a meta data model) is used to document the relevant elements and their relations of the here described methodology of a reusable functional failure test for a specific technical system. This embodiment of a first data structure can, for example, be used by the exemplary embodiment of FIG. 2.

The first data structure is capable to reflect the classic elements of the FMEA as described in FIG. 1 but extends the methodology by utilizing the relations. In this way, the reuse-functionality is enabled solving the problems as described in FIG. 1 (e.g., inconsistency).

In a variant of the method a predefined stimulus signal is transmitted to at least one of the technical elements of the specific technical system. The stimulus signal induces an expected failure mode and/or expected effect, wherein a response of the stimulus signal of the respective technical element is acquired and the response is compared with the expected failure mode and/or expected effect.

For example, if the response and the expected failure mode and/or effect match/maintained, the respective technical element is identified as functional.

For example, if the response and the expected failure mode and/or effect diverge from each other, the respective technical element is identified as faulty.

This variant can conduct an analysis of the specific technical system by triggering an expected behaviour (e.g., by means of the stimulus signal) of the technical elements of the specific technical system. For example, the responses of the technical elements and/or the specific technical system to the respective stimulus signal are recorded. Preferably, the recorded responses are evaluated and depending on the result the first/second data structures are updated and/or the technical elements and/or the technical systems are checked.

For example, this can be combined with a test environment/test bed to conduct functional failure tests for devices under testing (DUT). This can, for example, be used in a manufacturing plant for specific technical systems (e.g., products) for automated product tests, wherein each manufactured product/specific technical system should not exceed the predefined failure rate. For example, products exceeding the predefined failure rate can be sorted out and repaired in a workshop to meet the predefined failure rate.

Preferably, by means of the features of this embodiment the quality of the technical elements of the specific technical system can be evaluated.

FIG. 3 shows a first data structure for a functional failure test using generic functions and failure modes. In detail the first data structure can comprise the following datasets in various relationships to each other: a system 310 (e.g., describing a specific technical system in a general manner), a component 320 (e.g., a technical element of the specific technical system like a illumination unit), function 330 (e.g., a function the technical element should fulfill like illuminating at a certain level of darkness), a failure mode 340 (e.g., what can go wrong, for example, incorrect measurement of the darkness level), an effect 350 (e.g., what is the result of the failure, such as, no light is shown) a specific mitigation 360, an additional specific mitigation 365 and a potential accident 370. FIG. 3 shows, for example, an example for a possible relationship of these datasets together with possible cardinalities (e.g., 1, 0 . . . *, 1 . . . *) known from state of the art data modeling languages (e.g., UML). Furthermore, each item or dataset comprises a unique identifier.

By means of the first data structure and its items, for example, the above mentioned datasets, a huge catalog of predefined items such as, systems, components, functions, failure modes, effects, specific mitigations, additional specific mitigations and potential accidents can be provided. If a new item (e.g., effect, component, function etc.) is needed for a new technical element, it can simply be added to the catalog of predefined items. In such a case, the appropriate dataset is created and a new unique identifier is assigned to the new item.

If a functional failure test for a specific technical system is conducted. This large and complex specific technical system can be stripped down into manageable items, for example, an functional failure test can be conducted for each technical element by means of the respective component (datasets) and by calculating the respective failure rates.

In detail, each component 320 is a set of analyzable technical elements of the specific technical system or the respective system (dataset) 310 that build a logic unit. Each technical element of a component is associated to a function 330, for example, implemented in software or as a functionality in general of the system 310.

Each function 330 can fail in different ways, which is given by the failure mode 340. In this example, a functionality or the failure mode 340 can be inaccessible (loss L), it can be delayed (timeliness T), it can be erroneous (incorrect I) or it can be activated without being intended to (spurious S).

The first data structure implies, for example, a set of failure modes 340 (e.g., loss L, timeliness T, incorrect I, spurious S) for each function 330. For example, by implementing the first data structure a system implementing it makes the set of failure modes 340 to be analyzed consistent for every function 330.

Each failure mode 340 of a function 330 results in a certain effect 350 in the system 310 which corresponds to the physical behavior of the specific technical system. For example the delayed operation of a single function can lead to a delayed operation of the system. This can led to a certain accident (Potential Accident 370).

Using the first data structure, specific mitigations 360, such as preventive functions, human interaction or maintenance can be assigned to an effect 340 that mitigate the effect. Specific mitigations 360 can be combined with additional specific mitigations 365 to decrease the overall risk to an acceptable level.

Identical items like effects, functions or components are referenced to avoid parallel datasets which cause inconsistencies in a functional failure test.

To conduct a functional failure test for a specific technical system the necessary items for the specific technical system are selected from the first data structure. Afterwards, the selected items are instantiated to build the second data structure and conduct the functional failure test for the specific technical system.

Identical items can have a common instance or separate instances in the second data model. If an item of the first or the second data structure needs to be updated or is updated, necessary updates of identical items, item instances or the corresponding item of the first data structure can be found and tracked by using the unique identifier (each item of the first data structure has a different unique identifier and/or a unique instance identifier assigned during the instantiation of each item (each instance has a different unique instance identifier).

Consequently, if identical items are selected, during the instantiation each item instanced for the second data structure will comprise the respective identical unique identifier of the respective item of the first data structure. If a unique instance identifier is used, these instanced items additionally comprise the unique instance identifier. This means instances can have the identical unique identifier of their respective item of the first data structure, but have different unique instance identifier.

For example, during the instantiation of the items a lookup table can be created to track multiple instances of an item (e.g., if an identical item is selected several times). By means of the lookup table the execution time of update processes can, for example, be improved. This lookup table can, for example, be comprised by the second data structure or the first data structure. In case the second data structure comprises the lookup table, the first data structure can, for example, comprise a reference to second data structures which comprise instances of items of the first data structure.

Figure 4:
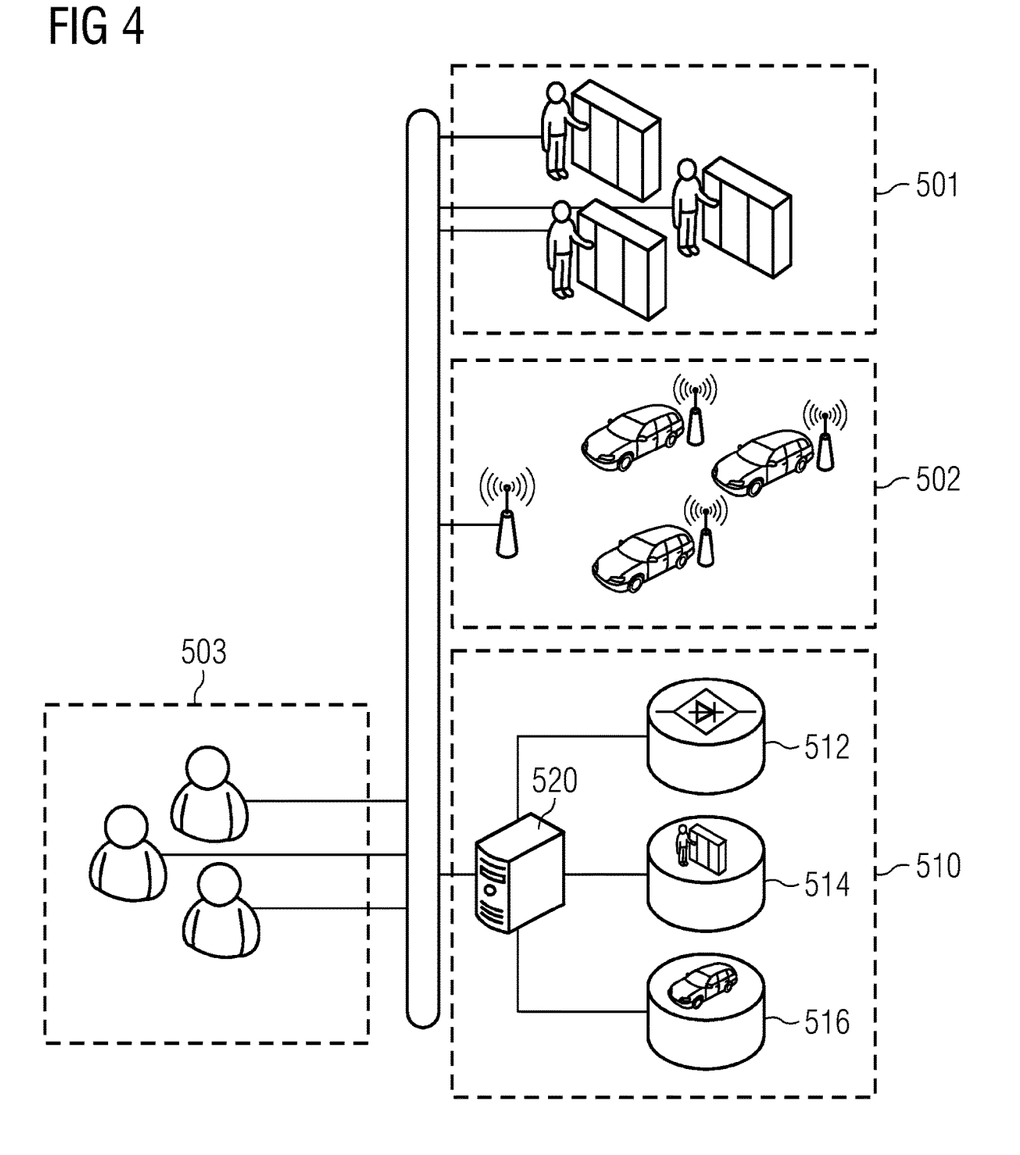
FIG. 4 shows an exemplary embodiment of a system.

FIG. 4 shows a possible exemplary embodiment of system implementing embodiments of the invention. Preferably, one or more features of this embodiment can be combined with the other embodiments of the invention.

In detail, FIG. 4 shows an exemplary implementation of embodiments of the invention, wherein the first data structure is implemented by a component database 512. Furthermore, a first specific technical system 501 and a second specific technical system 502 are depicted.

For example, a team of operators 503 (e.g., engineers, system designers, analysts) can select the corresponding items for the specific technical system to instantiate the respective second data structure. Preferably, this selection process is conducted by means of a computer system 520, which is connected to the component database 512.

For the first specific technical system 501 a second data structure 514 is instantiated, for example, by the computer system 520. Analogously, for the second specific technical system 502 a further (or another) second data structure 516 is instantiated, for example, by the computer system 520.

During the selection process identical items for reoccurring technical elements can be reused, without sacrificing the consistency of the first data structure and/or the second data structure(s).

When the second data structures with their instantiated items are available, a functional failure analysis (e.g., a functional failure test) can be conducted, as it is described in FIG. 2.

In other words, items, such as failure modes of components, functions or effects, that can, for example, be used to build a system (dataset) for a specific technical system (e.g., the first specific technical system 501 and the second specific technical system 502) are stored within a component database. These items can, for example, be used by operators 503 to instantiate a second data structure.

The operators 503 that analyze the specific technical system, e.g. the team of analysts, designers and engineers uses this first data structure (e.g., the component database 512) to create the corresponding second data structure(s) to conduct the functional failure analysis for a specific technical system, e.g., the second data structure 512 for the first specific technical system 501.

Filed data is, for example, associated to certain effects using a wired or wireless connection to the specific technical systems, e.g., using event logging mechanisms. Preferably, multiple functional failure tests can use the same data for components and failure modes. Since items as described in the previous embodiments use a unique identifier, the relations can be used in a database system the consistency problems mentioned in FIG. 1 can be avoided.

For example, if the number of failure modes of a specific component or electronic device needs to be altered, the new failure mode is inserted into the component database. Since all implementations (e.g., all instances of an item of the second data structure and/or item(s) of the first data structure) of a component refer, for example, to the unique identifier of a function, missing failure modes can automatically inserted to component for a specific system functional failure test.

Preferably, the operator team 503 can then be sure that all failure modes are listed to a function and the model in consistent. Preferably, based on the consistent failure modes, existing effects are selected from the first data structure for a specific technical system if they occur multiple times. In this way, an effect can, for example, be used many times (also called reusing an item) and it can be analyzed automatically where the effect is used in the analysis and the analysis also becomes more detailed since the failure rate can now be calculates separately for every effect. For example, using this consistent first data structure and/or second data structure has several advantages. For example, effects can be reused and consistent failure modes, consistent failure effects that are measured for every implementation of one of the specific technical system can be traced to the corresponding failure modes of involved components. For example, this tracing can be conducted in real-time, by a sensor installed in the specific technical system. Preferably, the respective sensor and/or technical element can be identified with the unique instantiation identifier.

This helps, for example, to identify components or electronic devices that do exceed the assumed failure rates and that might be repaired or replaced to keep implementations of the specific technical in the desired failure rate limitations of the analysis.

Figure 5:
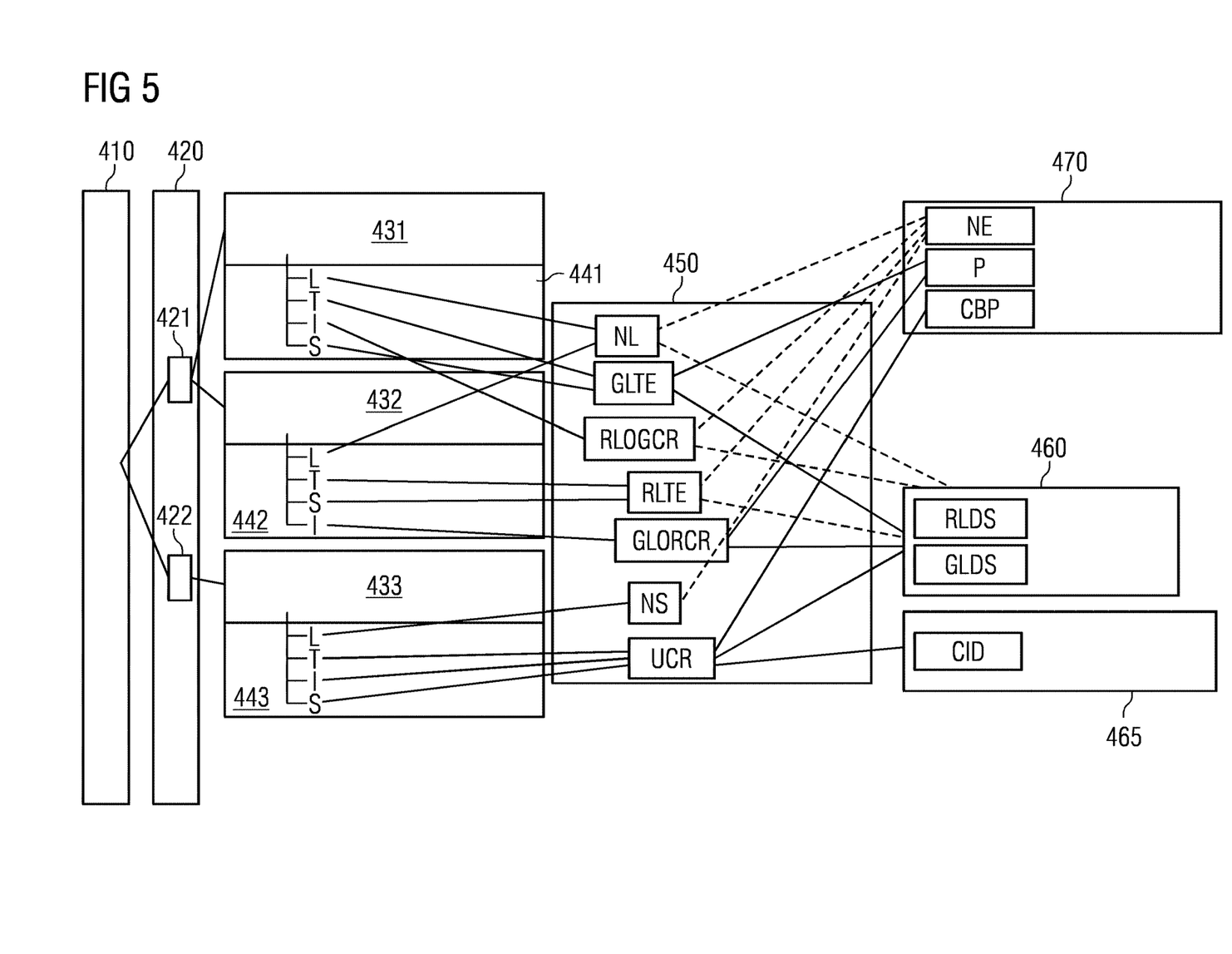
FIG. 5 shows an exemplary embodiment of a second data structure.

FIG. 5 shows a possible exemplary embodiment of a second data structure. Preferably, one or more features of this embodiment can be combined with the other embodiments of the invention.

In detail, FIG. 5 shows the resulting instantiated second data structure for a specific technical system, e.g. a traffic light system. With the inventive method a functional failure test of the traffic light system can be conducted continuously and/or at certain time and/or at predefined time intervals.

The traffic light system comprises several technical elements like a pedestrian light unit with two functions, e.g., "show green light for the pedestrian path parallel to the road with a green light" and "show red light for the pedestrian path parallel to the road with a red light". Furthermore, the traffic light system comprises crossway light unit with the function "show green light on one way, block the others with red light".

In other words, this implementation of the inventive method is applied to an analysis for optimizing and/or observing and/or testing a set of sensor equipment for the traffic light control system. Preferably, the both functions of the pedestrian light unit should signal green to the pedestrians parallel to the road and second to show red to the pedestrians if traffic goes trough.

Preferably, the crossway light unit has one function in this example, to show green and to block the other road showing red.

For example, some functional failures can occur and they have effects on the functions of the specific technical system. For example, if the functionality is loss, there is no light. Since then the traffic signs are used to control the traffic manually, it has no effect as a potential source for an accident. If, for example, the traffic light of the pedestrian light unit is either too late (timeliness), it shows the incorrect light (incorrect) or it spuriously switches the traffic light (spurious), it can result in an unblocked crossroad whiles the other road is showing green light. This can, for example, lead to a potential accident (car in blocking position).

To omit those failure modes and their effects or potential accidents, a mitigation measure is, for example, in place. For example, the green light of the other crossing road can be sensed. For example, by using this signal, there are prevention mechanisms implemented in the steering system of the crossroad light, that if one crossroad is showing green, the other is never switching to green. And since this is, for example, a very important safety aspect, there is also a car detection using an induction sensor as a second mitigation measure.

Since in a manually maintained table, failure modes, failure effects and mitigations are not maintained in a model, optimizations based on runtime measurements cannot be performed. In this example, implemented mitigations of the crossway can be analyzed and the system can be optimized based on runtime measurements of car accidents due to failures of the pedestrian light unit and/or crossway light unit. Preferably, additional measures can be analyzed and optimized for costs and impact on the prevention of accidents.

As described in the previous embodiments, an operator selects the corresponding items from the first data structure. The resulting second data structure is then instantiated based on these selected items and comprises the respective item instances.

In detail, the second data structure comprises a system (instance) 410 for the traffic light system. The system 410 comprises/references two components (instances) 420, for example, a pedestrian component 421 (for the pedestrian light unit) and a crossway component 422 (for the crossway light unit).

The pedestrian component 421 comprises/references two function (instances), a first function 431 to describe the "show green light for the pedestrian path parallel to the road with a green light" function of the pedestrian light unit and a second function 432 to describe the "show red light for the pedestrian path parallel to the road with a red light" function of the pedestrian light unit.

The crossway component 422 comprises/references a third function 433 to describe the "show green light on one way, block the others with red light" function of the crossway light unit.

Each function comprises/references a failure mode (instance) with the four states: loss L, timeliness T, incorrect I, spurious S. A more detailed description of these states can be found in the previous embodiments, e.g., FIG. 3.

In detail, a first failure mode 441 of the first function 431 comprises/references effects (instances) 450. In detail, the state loss L (of the first failure mode 441) comprises/references an effect "no light" NL. The state timeliness T (of the first failure mode 441) comprises/references an effect "Green Light To Early" GLTE. The state incorrect I (of the first failure mode 441) comprises/references an effect "Red Light on Green Crossroad" RLOGCR. The state spurious S (of the first failure mode 441) references the effect "Green Light To Early" GLTE.

In detail, a second failure mode 442 of the second function 432 comprises/references to the effects 450. In detail, the state loss L (of the second failure mode 442) comprises/references the effect "no light" NL. The state timeliness T (of the second failure mode 442) comprises/references an effect "Red Light To Early" RLTE. The state incorrect I (of the second failure mode 442) comprises/references an effect "Green Light on Red Crossroad" RLOGCR. The state spurious S (of the second failure mode 442) references the effect "Red Light To Early" RLTE.

In detail, a third failure mode 443 of the third function 433 comprises/references to the effects 450. In detail, the state loss L (of the third failure mode 443) comprises/references an effect "No Signaling" NS. The state timeliness T (of the third failure mode 443) comprises/references an effect "Unblocked Crossroad" UCR. The state incorrect I (of the third failure mode 443) comprises/references the effect "Unblocked Crossroad" UCR. The state spurious S (of the third failure mode 443) references the effect "Unblocked Crossroad" UCR.

The effects 450 can, for example, reference potential accidents (instances) 470. For example, the effects "No Light" NL, "No Signal" NS, "Red Light to Early" RLTE and "Red light on green crossroad" RLOGCR comprise/reference a potential accident "no effect" NE. For example, the effects "Green Light to Early" GLTE and "Green Light on Red Crossroad" GLORCR comprise/reference a potential accident "Pedestrian on Road with Traffic" P. For example, the effect "Unblocked Crossroads" UCR comprises/references a potential accident "Car in Blocking Position" CBP.

Each effect can, for example, be reference/comprise specific mitigations (instances) 460 and/or additional specific mitigations (instances) 465. The specific mitigations (instances) 460 can, for example, be a red light detection sensor RLDS and a green light detection sensor GLDS which monitor the light emitted by the lights of the traffic light system. The additional specific mitigation (instance) 465 can, for example, be an inductive car detection sensor CID.

For example, in this embodiment the effects 450 "no light" NL and/or "Green Light To Early" GLTE and/or "Red Light on Green Crossroad" RLOGCR and/or "Red Light To Early" RLTE and/or "Green Light on Red Crossroad" GLORCR and/or "No Signaling" NS reference/comprise the both specific mitigations (instances) 460, e.g. the red light detection sensor RLDS and the green light detection sensor GLDS. In this way, the specific mitigations 460 can, for example, are reused.

Furthermore, the effect "Unblocked Crossroads" UCR can, for example, comprise/reference the specific mitigations (instances) 460, e.g., red light detection sensor RLDS and green light detection sensor GLDS and additionally comprise/reference additional specific mitigation (instance) 465, e.g., the inductive car detection sensor CID. Preferably, in this way the specific mitigations 460 and the additional specific mitigations 465 can easily be combined and reused.

Figure 6:
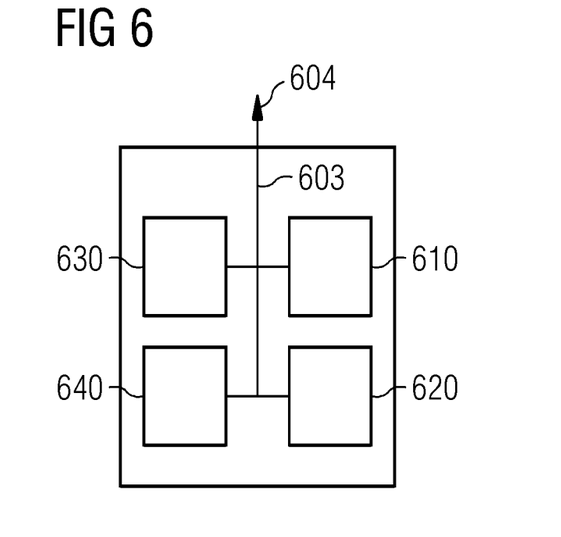
FIG. 6 shows an exemplary embodiment of the invention as an apparatus.

FIG. 6 shows a possible exemplary embodiment of the invention as an apparatus. Preferably, one or more features of this embodiment can be combined with the other embodiments of the invention.

In detail, FIG. 6 shows an apparatus for a reusable functional failure test for a specific technical system, comprising a selection module 620, an instantiation module 620, an execution module 630, a test module 640 and optionally an interface 604, which are communicatively coupled or connected by a first bus 603 (e.g. a data bus such as a PCI (Peripheral Component Interconnect) bus).

The selection module 610 is configured to select from items of a first data structure at least one component for each technical element of the specific technical system, wherein
each component can comprise at least one function,
each function can comprise at least one failure mode,
each failure mode can comprise at least one effect,
each item comprises a unique identifier, and
identical items are reused.

The instantiation module 620 is configured to instantiate a second data structure based on the selected items for the specific technical system, wherein a processor instantiates the respective items.

The execution module 630 is configured to execute 630 the functional failure test for the specific technical system by calculating the failure rates for each component.

The test module 640 is configured to test each component whether the respective components exceed/s a predefined failure rate. For example, the result can be provided by a control signal.

The apparatus can, for example, comprise further components, such as a further processor and/or a memory unit and/or sensors to observe the technical elements of the specific technical system and/or further interfaces to communicate with the technical system (e.g., to acquire internal system states). Preferably, the apparatus comprises at least one further component, such as an input device (e.g. a computer keyboard or computer mouse) or a display device (e.g., a TFT-Monitor).

Each module can, for example, be implemented by the further processor and/or another further processor and/or the memory unit. Furthermore, a software component can be used to implement a module completely or partially. Preferably, a separate software module is implemented for each module or a common software module is implemented for all modules.

By executing executable instruction of the software module(s) the further processor and/or the other further processor is specifically configured to perform the functionality of one of the modules. This can, for example, be implemented by an ASIC which is specifically configured by these instructions during an manufacturing process or an FPGA which is specifically configured during a configuration process.

Summarized, embodiments of the invention relates to a computer based method (e.g., implemented by the apparatus) for a reusable functional failure test for a specific technical system, e.g. a traffic light system. The inventive method avoids inconsistencies in the functional failure test and reuses items of the respective data structures. Furthermore, embodiments of the invention can identify components or electronic devices that do exceed assumed failure rates and that might be repaired or replaced to keep implementations of the specific technical in the desired failure rate limitations of the analysis. Preferably, this can be done during the operation of the specific technical system.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While certain exemplary embodiments have been described and shown in the accompanying drawings, it is to be understood that such embodiments are merely illustrative of, and not restrictive on, the broad invention, and that this invention not be limited to the specific constructions and arrangements shown and described, since various other modifications may occur to those ordinarily skilled in the art.

The described embodiments and developments can be combined in any manner with one another as far as this is expedient. Further possible embodiments, developments and implementations of the invention also comprise not specifically cited combinations of features of the invention described above or in the following in relation to the exemplary embodiments.

The invention claimed is:

1. A computer-based method for a reusable functional failure test for a specific technical system, the method comprising:
    selecting, by a processor of a computing system, from items of a first data structure, at least one component for each technical element of the specific technical system, wherein:
    each component comprises at least one function,
    each function comprises at least one failure mode,
    each failure mode comprises at least one effect,
    each item comprises a unique identifier, and
    identical items are reused;
    instantiating, by the processor, a second data structure based on the selected component for each technical element of the specific technical system;
    executing, by the processor, the reusable functional failure test for the specific technical system by calculating the failure rates for each component; and
    testing, by the processor, each component whether the respective components exceed a predefined failure rate.

2. The method according to claim 1, wherein:
    each effect comprises at least one specific mitigation and/or at least one additional specific mitigation; and
    the processor instantiates each of the specific mitigation and/or additional specific mitigation for the second data structure.

3. The method according to claim 1, wherein:
    each effect comprises a potential accident; and
    the processor instantiates each of the potential accident for the second data structure.

4. The method according to claim 1, wherein the failure modes are loss and/or timeliness and/or incorrect and/or spurious.

5. The method according to claim 1, wherein each instantiated item comprises an unique instance identifier.

6. The method according to claim 1, wherein an update of one of the reused item and/or item instances of the second data structure and/or the items of the first data structure automatically triggers an update of other instances of the corresponding reused item.

7. The method according to claim 1, wherein an update of one of the item instances in the second data structure automatically triggers an update of the corresponding item in the first data structure.

8. The method according to claim 1, wherein one of the item instances of the second data structure is updated by sensor data of the specific technical system.

9. The method according to claim 6, wherein:
    a predefined stimulus signal is transmitted to at least one of the technical elements of the specific technical system;
    the stimulus signal induces an expected failure mode and/or expected effect;
    a response of the stimulus signal of the respective technical element is acquired; and
    the response is compared with the expected failure mode and/or expected effect.

10. The method according to claim 9, wherein if the response and the expected failure mode and/or effect diverge from each other, the respective effect instance and/or failure mode instance is updated according to the response.

11. The method according to claim 9, wherein if the response and the expected failure mode and/or effect match, the respective the respective technical element is identified as functional.

12. The method according to claim 9, wherein if the response and the expected failure mode and/or effect diverge from each other, the respective the respective technical element is identified as faulty.

13. An apparatus for a reusable functional failure test for a specific technical comprising:
    a selection module, wherein:
    the selection module selects from items of a first data structure at least one component for each technical element of the specific technical system,
    each component comprises at least one function,
    each function comprises at least one failure mode,
    each failure mode comprises at least one effect,
    each item comprises a unique identifier, and
    identical items are reused;
    an instantiation module for instantiating a second data structure based on the selected component for each technical element of the specific technical system, wherein a processor instantiates the respective items;
    an execution module for executing the reusable functional failure test for the specific technical system by calculating the failure rates for each component; and
    a test module for testing each component whether the respective components exceeds a predefined failure rate.

14. A computer program product, comprising a computer readable hardware storage device having computer readable program code stored therein, said program code executable by a processor of a computer system to implement a method according to claim 1.

15. A providing device for the computer program product according to claim 14, wherein the providing device provides and/or saves the computer program product.

\* \* \* \* \*